(12) United States Patent
Lu et al.

(10) Patent No.: US 11,221,564 B2
(45) Date of Patent: Jan. 11, 2022

(54) METHOD FOR IMPROVING EXPOSURE PERFORMANCE AND APPARATUS THEREOF

(71) Applicant: TAIWAN SEMICONDUCTOR MANUFACTURING COMPANY LTD., Hsinchu (TW)

(72) Inventors: Chao Pei Lu, Taipei (TW); Yung-Yao Lee, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/401,279

(22) Filed: May 2, 2019

(65) Prior Publication Data

US 2020/0133142 A1 Apr. 30, 2020

Related U.S. Application Data

(60) Provisional application No. 62/753,394, filed on Oct. 31, 2018.

(51) Int. Cl.
*G03F 7/20* (2006.01)

(52) U.S. Cl.
CPC .............................. *G03F 7/70891* (2013.01)

(58) Field of Classification Search
CPC .................................................. G03F 7/70891
See application file for complete search history.

(56) References Cited

U.S. PATENT DOCUMENTS

| | | | | |
|---|---|---|---|---|
| 5,390,227 A * | 2/1995 | Mizusawa | ........... | G03F 7/70066 378/150 |
| 2005/0270513 A1* | 12/2005 | Dierichs | ............. | G03F 7/70108 355/67 |
| 2006/0139608 A1* | 6/2006 | Wiener | ............... | G03F 7/70191 355/69 |
| 2007/0014112 A1* | 1/2007 | Ohya | .................. | G03F 7/70191 362/268 |
| 2007/0268473 A1* | 11/2007 | Kawahara | ........... | G03F 7/70083 355/67 |
| 2009/0039292 A1* | 2/2009 | Lee | ..................... | G03F 7/70208 250/492.2 |
| 2009/0073404 A1* | 3/2009 | Muramatsu | ......... | G03F 7/70425 355/53 |
| 2009/0135394 A1* | 5/2009 | Van Greevenbroek | ..................... | G03F 7/70191 355/67 |
| 2010/0302525 A1* | 12/2010 | Zimmerman | ....... | G03F 7/70133 355/71 |
| 2012/0262685 A1* | 10/2012 | Zimmerman | ....... | G03F 7/70083 355/52 |

* cited by examiner

*Primary Examiner* — Deoram Persaud
(74) *Attorney, Agent, or Firm* — WPAT, P.C., Intellectual Property Attorneys; Anthony King

(57) ABSTRACT

A method of operating an illuminator and apparatus thereof are proposed. A method includes: directing a radiation beam to the illuminator comprising slit fingers; sensing a temperature value of each of the slit fingers; determining a shifting value of the respective slit finger based on the temperature value; causing the respective slit finger to move according to the shifting value to form a light slit from the radiation beam; and exposing a workpiece using the light slit.

20 Claims, 5 Drawing Sheets

METHOD FOR IMPROVING EXPOSURE PERFORMANCE AND APPARATUS THEREOF

PRIORITY CLAIM AND CROSS-REFERENCE

This application claims priority to U.S. Provisional Application No. 62/753,394 filed Oct. 31, 2018, the disclosure of which is hereby incorporated by reference in its entirety.

BACKGROUND

In advanced semiconductor technologies, the continuing reduction in device size and increasingly complicated circuit arrangements have made the design and fabrication of integrated circuits (ICs) more challenging and costly. Therefore, there is a continuous need to modify the structure and method of designing and manufacturing the semiconductor devices in order to improve device robustness as well as reduce manufacturing cost and processing time.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
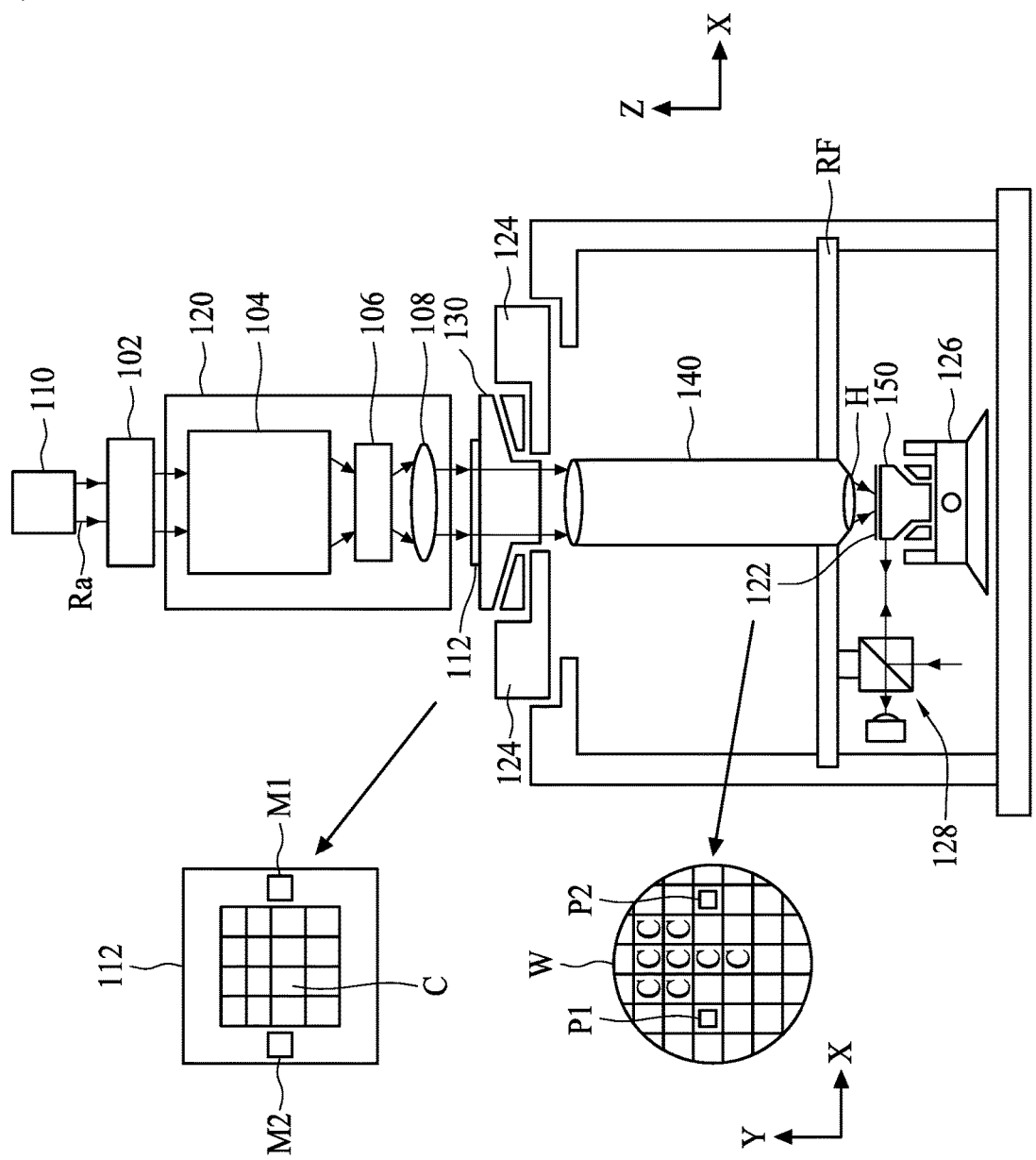
FIG. 1 is a schematic diagram of a lithography apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 70 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Lithography is one of the essential processes in manufacturing integrated circuits (ICs) as well as other semiconductor devices. During manufacture of the IC with a lithographic apparatus, a patterning device (which is referred to as a photomask or a reticle) is configured to transfer a circuit pattern to an individual layer of a substrate. Transfer of the circuit pattern is typically conducted via imaging on a layer of radiation-sensitive material (e.g., a resist) provided on the substrate. The substrate generally contains an array of exposure fields, or simply fields, thereon in which the area of one field is exposed at a time. To reduce manufacturing cost of ICs, the exposure task is generally performed on the fields in succession with a short idle time. That is, in order to reduce the cost and time of exposure, the idle time between subsequent exposures is minimized. Thus, the lithographic apparatus may absorb heat of radiation which causes deformation of the apparatus's components, such as the slit fingers used for shaping the exposure illumination or radiation. Undesirable side-effects of the exposure radiation, such as drift, movement, and profile uniformity reduction, may accordingly occur, and adversely affect the imaging quality.

Throughout the present disclosure, the term "uniform" or "uniformity" refers to a constant intensity profile of the radiation across the entire target exposure area. In some cases, the term "uniform" or "uniformity" also refers to the ability to control the illumination onto a target illumination profile. The target illumination uniformity may include a flat (i.e., equal intensity) or a non-flat profile. An illumination or radiation (called a slit when it is shaped to illuminate the circuit pattern) is considered uniform if the measured intensities of the illumination across the entire beam fall below predetermined thresholds of deviation from the target illumination profile. It is widely known that the sensitivity of the imaging quality to the illumination uniformity is increased along with the reduction of the minimal line width of the circuit pattern to be imaged. As the industry has strived to shrink the minimal line width in advanced technology generations, the issue of illumination uniformity in the exposure operation is thus more critical to the fabrication of defect-free semiconductor devices with the required line width.

The illumination profile of the exposure radiation, i.e., the slit uniformity, is generally determined by a bank of movable slit fingers that intersect the incident radiation (slit). By moving the slit fingers the slit intensities at the corresponding finger portions can be adjusted on demand. In the present disclosure, a method and apparatus for managing the slit uniformity is proposed. A temperature-based feedback control mechanism is adopted to monitor the temperatures of each of the slit fingers. The positions of the slit fingers are adjusted based on the measured temperature values and the temperature differences between consecutive measurements on the slit fingers. Through the feedback of in-situ temperature sensing data, the shifting values for the slit fingers can be determined more accurately and the radiation uniformity can be better controlled.

FIG. 1 is a schematic diagram of a lithography apparatus 100 in accordance with some embodiments. The present embodiment illustrates a transmissive-type lithography apparatus, but the disclosure is not limited thereto. Other types of lithography apparatus, such as a reflective-type lithography apparatus, may also be within the contemplated scope of the present disclosure. The lithography apparatus 100 includes a radiation source 110, an illuminator 120, a reticle stage 130, a projection module 140 and a wafer stage 150.

The radiation source 110 is configured to emit a radiation beam Ra as a source of lithographic exposure. The radiation source 110 may an excimer laser or a mercury lamp. In an embodiment, the radiation beam Ra is configured to emit EUV light with a wavelength between about 1 nm and about 100 nm, such as 13.5 nm. The source 110 and the lithography apparatus 100 may be separate entities or an integral structure. The illuminator 120 is disposed below the radiation source 110 and receives the incident radiation beam Ra from the radiation source 110. In an embodiment, a beam delivery module 102, which may include beam directing mirrors and/or a beam expander, is disposed between the radiation source 110 and the illuminator 120 and configured to direct the radiation beam Ra when an excimer laser is adopted as the radiation source 110. The illuminator 120 may comprise a cascade of optical elements for conditioning the incident radiation Ra as desired. For example, the illuminator 120 comprises a conditioning module 104, a uniformity control module 106 and a condenser 108.

The conditioning module 104 is configured to adjust the angular intensity distribution of the radiation beam Ra, e.g., the outer and/or inner radial extent of the intensity distribution in a pupil plane of the illuminator 120. The conditioning module 104 may include, e.g., a collimator, a field defining element and a field lens group arranged in sequence. In an embodiment, the collimator can be used to collimate the radiation beam Ra. In an embodiment, the field defining element is configured to form the radiation beam Ra into a field shape, which will be projected onto a workpiece 122 (e.g., a semiconductor wafer). The field defining element may, for example, comprise two arrays of convex lenses, the second array being placed in the focal plane of the first array.

In an embodiment, the field lens group can focus the radiation beam onto a field plane.

In an embodiment, the uniformity control module 106 receives the radiation beam Ra in the field shape and is configured to manage the intensity profile of the radiation beam Ra which is to be projected onto the workpiece 122. In an embodiment, the uniformity control module 106 includes at least one array of slit fingers (illustrated as fingers 202 in FIG. 2). Each of the slit fingers is movable into and out of intersection with the radiation beam Ra incident on the slit fingers, so as to selectively adjust an intensity level of the radiation beam at the respective slit finger. The slit fingers are arranged in parallel and adjacent fingers can be overlapping or non-overlapping. The uniformity control module 106 is illustrated in greater detail in FIG. 2. After passing through the uniformity control module 106, the radiation beam Ra is incident upon a condensing lens 108. The condensing lens 108 is configured to focus the radiation beam Ra onto another field plane.

In an embodiment, the illuminator 120 further includes a masking module (not shown in FIG. 1) between the uniformity control module 106 and the condenser 108. The masking module is configured to ensure that, during exposure of a targeted field, the radiation does not leak and illuminate upon adjacent fields. In an embodiment, the masking module is formed of a pair of blades moveable in the scanning direction of the lithography apparatus 100 and configured to control the opening area in which the radiation beam Ra can pass through.

The reticle stage 130 is disposed below the illuminator 120 and configured to support and secure a patterning device 112 (e.g., a photomask or a reticle). The radiation beam Ra traverses through the condenser 108 of the illuminator 120 for illuminating the patterning device 112 and thereby forms a circuit pattern according to the patterns on the patterning device 112.

The projection module 140 is disposed under the reticle stage 130 and is configured to transfer a circuit pattern towards the workpiece 122 on the wafer stage 150. The projection module 140 may be constructed of one or more mirrors or lenses to project the circuit pattern-containing radiation beam Ra onto the workpiece 122 with a magnification factor equal to or less than one. In an embodiment, the workpiece 122 is a substrate and may include a suitable radiation-sensitive material. The workpiece 122 is generally provided in a form of semiconductor wafer.

Although the illustrated lithography apparatus 100 includes only the illuminator 120 between the radiation source 110 and the reticle stage 130, other configurations are possible. For example, in a reflective-type lithography apparatus, one or more mirrors may be alternatively or additionally disposed in the propagation path of the radiation beam Ra between the radiation source 110 and the reticle stage 130, either before or after the appearance of the illuminator 120. In an embodiment, the illuminator 120 is arranged to process the radiation slit before the radiation slit impinges onto the patterning device so as to ensure the imaging quality of the exposure pattern.

In some embodiments, the lithography apparatus 100 further includes positioning tools for performing alignment between the workpiece 122 and the patterning device 112 so as to transfer the patterns on predetermined positions of the workpiece 122 precisely. In the present embodiment, a first positioning module 124 is coupled to the reticle stage 130 and configured to move the reticle stage 130 such that the radiation beam Ra can precisely align with the patterning device 112 after the patterning device 112 is retrieved from a mask library or moved during a step-and-scan operation. FIG. 1 also illustrates an exemplary top view of the patterning device 112 to the left side of the illuminator 120. The patterning device 112 includes a pattern area C in the central portion and alignment marks M1 and M2 on sides of the pattern area C. The radiation beam Ra is thus converted into an exposure pattern beam through the patterning device 112. In an embodiment, the alignment by the first positioning module 124 may be realized with the aid of a long-stroke unit (for coarse positioning) and a short-stroke unit (for fine positioning), which form parts of the first positioning module 124. In another embodiment, if the pattern area C includes several grid areas (cells), the alignment mark M1 or M2 may be formed in other locations of the patterning device 112, e.g., they may be located in spaces between the cells.

Similarly, the lithography apparatus 100 further includes a second positioning module 126 coupled to the wafer stage 150 and configured to align the workpiece 122 with the patterning device 112. In an embodiment, the movement of the wafer stage 150 may be realized using a long-stroke unit and a short-stroke unit for performing coarse and fine adjustments, respectively. FIG. 1 also illustrates an exemplary top view of the workpiece 122 to the left side of the wafer stage 150. The workpiece 122 may be partitioned into an array of fields in the central portion and alignment marks P1 and P2 on sides of the field array. The patterning device 112 and the workpiece 122 may be aligned using the alignment marks M1, M2 and the alignment marks P1, P2 collaboratively. During the exposure operation, each grid in the array of the fields is aligned with the pattern area C in the patterning device 112 and receives the radiation patterning successively in order to transfer the circuit pattern in the patterning device 112 onto the grids of the workpiece 122. In another embodiment, the alignment mark P1 or P2 may be formed in other locations of the workpiece 122, e.g., they may be located in spaces between the grids of fields (known as scribe-lane alignment marks).

In an embodiment, the lithography apparatus 100 includes an alignment sensor 128 configured to monitor the alignment performance. In an embodiment, the alignment sensor 128 may be structured by an interferometric device, a linear encoder, a capacitive sensor or the like.

Figure 2:
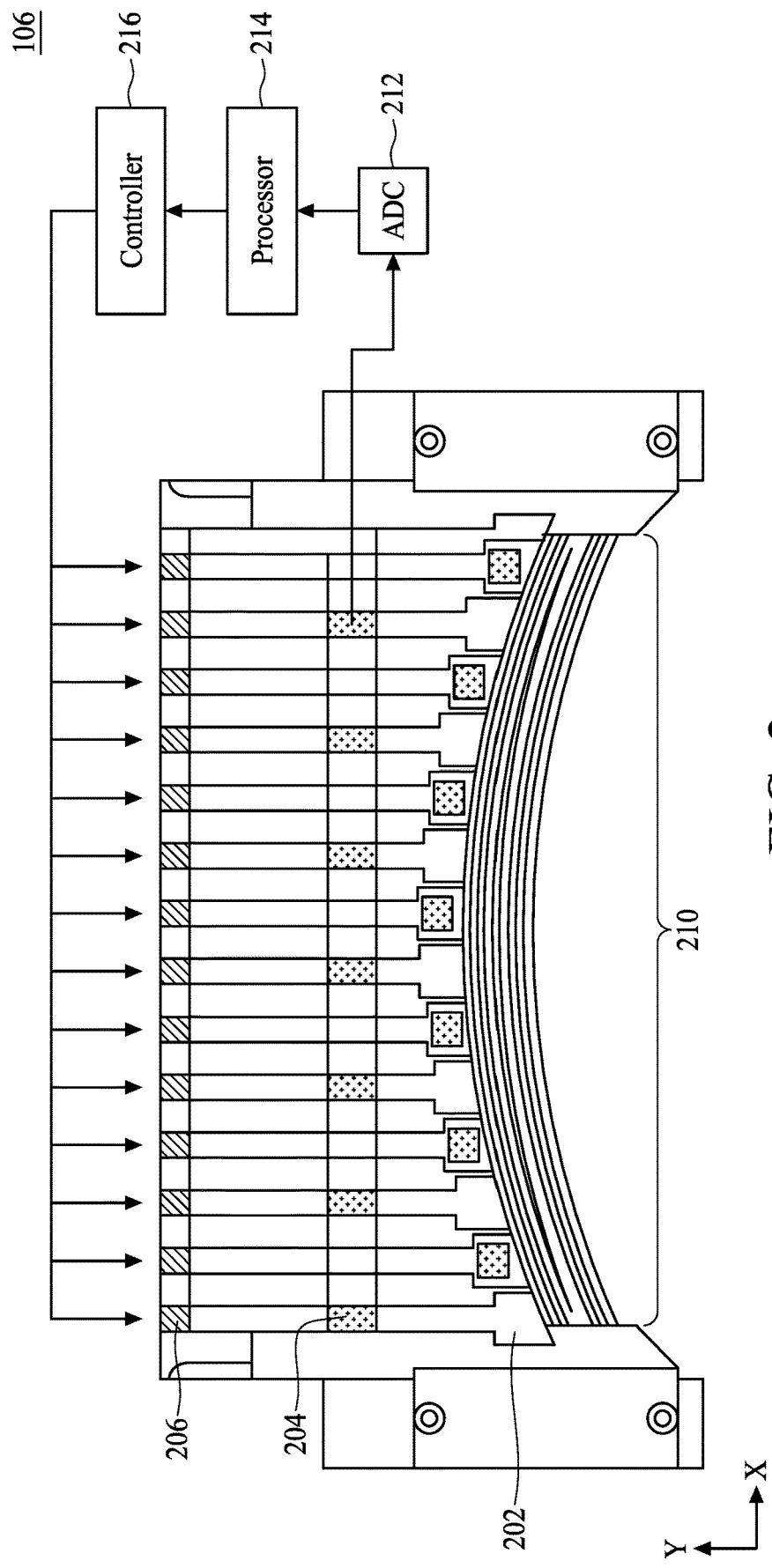
FIG. 2 is a schematic diagram of a uniformity control module of the lithography apparatus in FIG. 1, in accordance with some embodiments.

FIG. 2 is a schematic diagram of the uniformity control module 106 of the lithography apparatus 100 in FIG. 1, in accordance with some embodiments. The uniformity control module 106 includes a bank of slit fingers 202, a bank of temperature sensors 204 and a bank of actuating devices 206. In an embodiment, each of the temperature sensors 204 and each of the actuating devices 206 correspond to the respective slit fingers 202. Referring to FIG. 1 and FIG. 2, when the radiation beam Ra is incident onto the uniformity control module 106 in the Z direction, the slit fingers 202 extending in the XY-plane may intersect with the radiation beam Ra in a substantially perpendicular direction. In an embodiment, each of the slit fingers 202 is configured to move substantially along the Y direction in order to control the amount of radiation in the radiation beam Ra emitting towards the condenser 108 in FIG. 1. In the present embodiment, the radiation beam Ra passing through the slit fingers 202 is formed having a profile of an arc shape in the XY-plane and is referred to as an illumination slit, light slit, or simply slit 210. However, other shapes of the light slit 210 are also within the contemplated scope of the present disclosure. In the present embodiment, the slit fingers 202 are arranged on a same side of the light slit 210, but the slit fingers 202 can alternatively be arranged on opposite sides of the slit 210 in some other embodiments. By controlling the movement of the slit fingers 202 individually or in coordination into and out of intersection with the light slit 210, the radiation profile of the light slit 210 can be determined.

In an embodiment, the temperature sensor 204 is coupled to the respective slit finger 202 and configured to provide sensing results of the respective slit finger 202. All of the temperature sensors 204 are disposed adjacent to the tip portion of the slit fingers 202 for acquiring temperature measurements close to the light slit. In an embodiment, as shown in FIG. 2, only some of the temperature sensors 204 are disposed adjacent to the tip portion of the slit fingers 202. The temperature sensor 204 may also be disposed in other positions, such as in a middle portion of the slit finger 202, for acquiring the temperature results representative of the respective slit finger 202. The temperature sensors 204 may be arranged at the tip portion and the middle portion of the slit finger 202 in an alternating manner. In an embodiment, one slit finger 202 may include more than one temperature sensor 204, e.g., the temperature sensors 204 may be disposed in different locations of the respective slit finger 202, for providing a more comprehensive sensing result of a slit finger 202. The temperature sensor 204 may be formed by a variety of structures, such as a thermocouple, a resistance temperature detector, a thermistor, a resistive temperature detector (RTD), a semiconductor based IC, or the like.

In an embodiment, the actuating devices 206 are configured to provide driving force to move the respective slit fingers 202 in the Y direction. In an embodiment, the actuating device 206 may be, e.g., a motor, a piezoelectric device, a hydraulic device, a pump, or the like. The actuating devices 206 operate in conjunction with the sensors coupled to the slit finger 202, such as the temperature sensor 204, based on control signals sent by a control module. Each actuating device 206 is configured to operate independently of other actuating devices, although, in some embodiments, the actuating devices 206 can operate simultaneously.

In an embodiment, the uniformity control module 106 further includes a bank of position sensors (not shown) configured to detect the positions or shift values of each slit finger 202. The position sensors may detect the actual positions of the slit fingers 202 with respect to a reference position. Alternatively, the position sensors may provide relative shift values of the slit fingers 202 with respect to a predetermined reference slit finger 202. In an embodiment, the position sensors include a magnetic position sensor, an optical position sensor, an ultrasonic position sensor, a capacitive position sensor, or the like. In an embodiment, the position sensor may be disposed on the same side of the actuating device 206 as the slit fingers 202. In an embodiment, the actuating device 206 and the position sensor are integrally constructed. In an embodiment, the position sensor may be spaced apart from the slit fingers 202 without direct contact therewith.

During operation, each of the temperature sensors 204 is configured to sense a temperature value of the respective slit finger 202. In an embodiment, the temperature sensor 204 provides analog temperature values. The sensing result indicating the analog temperature values are sent to an analog-to-digital converter (ADC) 212 to digitize or quantize the sensed temperature value. A processor 214 is configured to receive the temperature data, in an analog or digitized form, and determine a shifting value of the respective slit finger 202 in an attempt to compensate for the slit intensity errors. In an embodiment, it is found that the shift value of a certain finger 202 may affect the optical field distribution around that slit finger 202. Moreover, in some embodiments, the compensation shift for the slit fingers 202 can be derived based upon the sensed temperature data via the temperature sensors 204. Accordingly, the processor 214 is configured to determine the compensation shift of each finger 202 based on at least the temperature values of the slit fingers 202. In an embodiment, a controller 216 is configured to receive the shifting values provided by the processor 214 and sending a control signal indicating the shifting value to the actuating devices 216 of the respective fingers 202. In an embodiment, the sensing and compensation operations are conducted in an iterative fashion through the loop formed by the temperature sensors 204, the ADC 212, the processor 214, the controller 216 and the actuating device 206 until the desired slit uniformity is achieved.

Figure 3B:
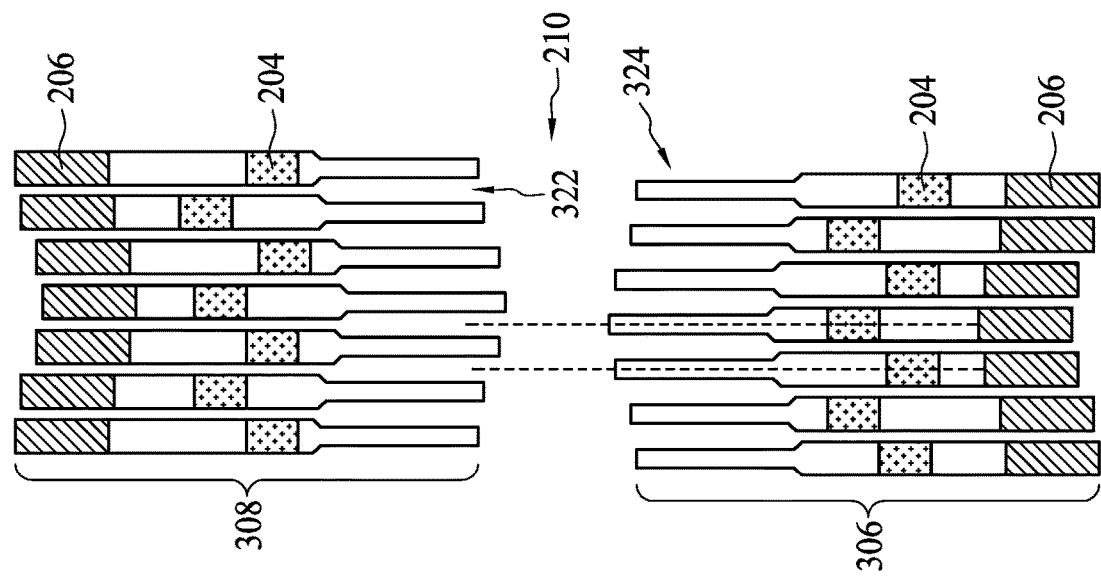
FIGS. 3A and 3B are schematic top views of fingers of the uniformity control module in FIG. 2, in accordance with some embodiments.
Figure 3A:
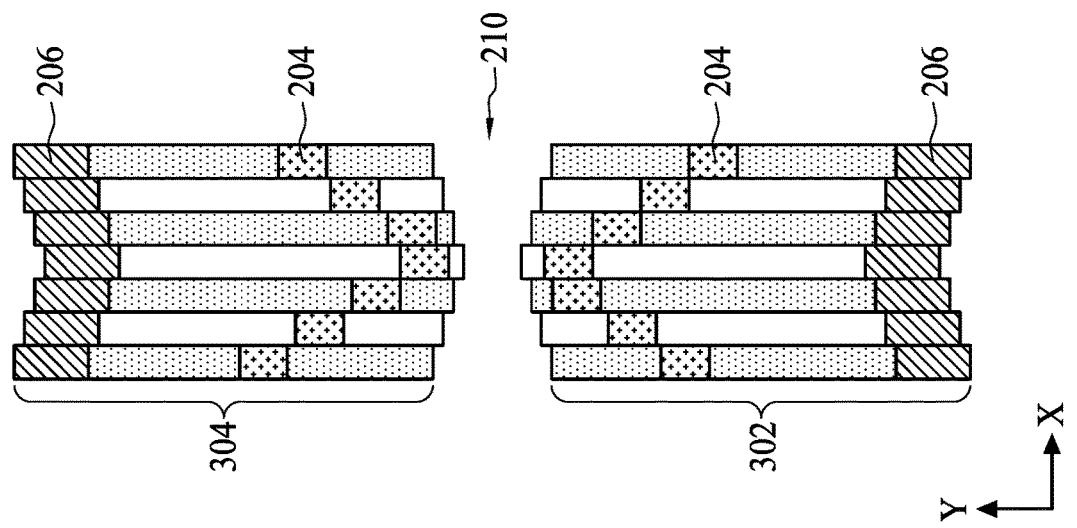

FIGS. 3A and 3B are schematic top views of the slit fingers 302 and 304 of the uniformity control module 106 in FIG. 2, in accordance with some embodiments. FIG. 3A shows opposite banks of slit fingers 302 and 304 in which each of the bank of fingers 302 or 304 may correspond to the slit fingers 202 in FIG. 2. In an embodiment, the bank of slit fingers 302 and the bank of slit fingers 304 are moveable substantially along the Y direction and function cooperatively to form the light slit 210 that traverses through the space between the slit fingers 302 or 304. As a result, the slit fingers 302 and 304 may be used to condition the profile and intensity of the incident radiation Ra, thereby controlling uniformity of the slit 210. In an embodiment, a plurality of temperature sensors 204 and a plurality of actuating devices 206 are disposed to respective slit fingers 302 and 304. The configuration and functions of the temperature sensors 204 and the actuating devices 206 have been described with reference to FIG. 2, and thus are omitted for simplicity.

In an embodiment, each of the fingers 302 or 304 has a width along the axial direction or the direction (e.g., the Y direction) in which the slit finger 302 or 304 moves. In an embodiment, the slit finger 302 or 304 includes a first portion proximal to the actuating device 206 and a second portion distal to the actuating device 206, wherein the first portion and the second portion have substantially equal widths. In an embodiment, the actuating device 206 includes a width substantially equal to that of the slit finger 302 or 304. In an embodiment, the temperature sensor 204 includes a width substantially equal to that of the finger 302 or 304.

In an embodiment, all of the slit fingers 302 or 304 may be arranged side by side at a same level. In an embodiment, alternate fingers in the bank of slit fingers 302 or 304 may be located in two different planes in the Z direction. For example, in FIG. 3A, the gray-shaded slit fingers of the slit fingers 302 or 304 may be in a first plane, while the white-shaded slit fingers of the slit fingers 302 or 304 may be in a second plane. In an embodiment, placing slit fingers 302 or 304 in different planes may allow them to at least overlap each other, which can render a smoothing effect on the slit profile.

FIG. 3B illustrates a bank of slit fingers 306 and a bank of slit fingers 308 according to an embodiment of the invention. The bank of slit fingers 306 may be opposite to the bank of slit fingers 308 for forming the light slit 210 therebetween. In an embodiment, a plurality of temperature sensors 204 and a plurality of actuating devices 206 correspond to the slit fingers 306 or 308. The slit finger 306 or 308 may include a first portion (base portion) proximal to the actuating device 206 and a second portion (or tip portion) distal to the actuating device 206, wherein the first portion and the second portion are of different widths. The second (tip) portion may have a width less than the first (base) portion, e.g., the second (tip) portion may have a width between about ⅓ to about ½ of the first (base) portion. In an embodiment, the temperature sensor 204 or actuating device 206 includes a width substantially equal to the first (base) portion of the finger 306 or 308.

Existing light slit calibration approaches do not address the relationship between the light slit non-uniformity and the finger temperatures. In some conventional lithography apparatus, sensors are used merely to monitor the temperature of the apparatus itself, such as the coil plate or the encoder plate, in order to keep the operating condition of exposure within the normal range; however, such monitoring schemes do not help maintain the light slit uniformity and are not capable of accessing the temperature information of the slit fingers. In addition, when the slit fingers in such conventional apparatus require resetting of the light slit profile during a long exposure cycle, the slit fingers can only be tuned while offline, and cannot continuously track the slit profile variation due to the thermal effect. In addition, the temperature variation of the slit fingers cannot be controlled in an efficient manner given the physical constraints of the existing lithography apparatus. Therefore, there is a need to resolve such inter-shot slit non-uniformity, especially in the era of EUVL.

It is found that the slit finger temperature provides another way of monitoring light slit uniformity that does not require direct measurement of the light slit profile and is a more efficient, reliable and real-time approach to determining the shifting values of individual slit fingers. In other words, the contribution of each slit finger to the deviation of the light slit uniformity can be effectively observed within a short period of time. The required idle time between consecutive exposure operations can be reduced accordingly.

Figure 4:
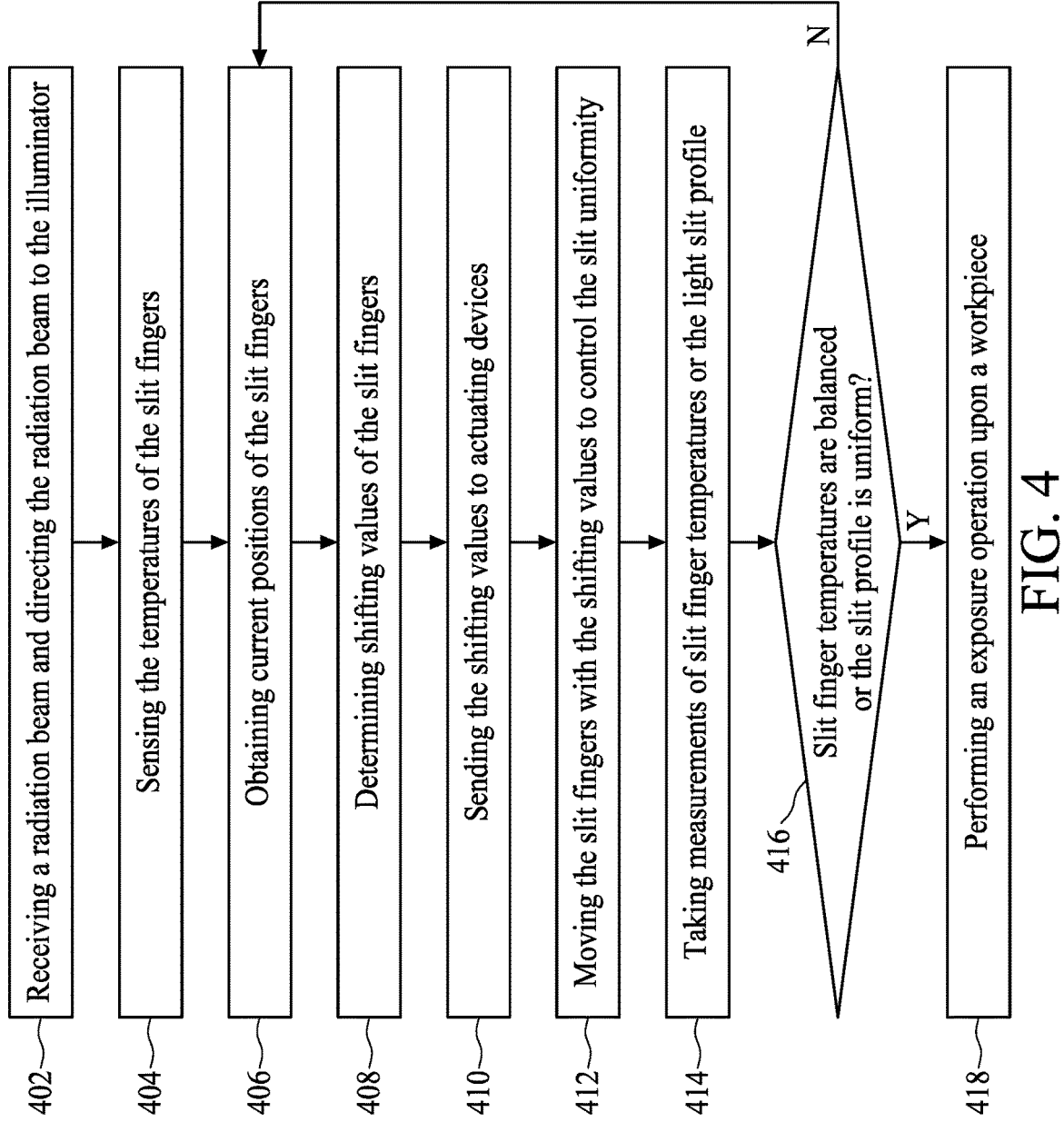
FIG. 4 is a flowchart showing a method of operating an illuminator, in accordance with some embodiments.

FIG. 4 is a flowchart of a method 400 of operating an illuminator, in accordance with some embodiments. The method 400 can be part of the procedure for manufacturing a semiconductor device, such as on a semiconductor wafer. It shall be understood that additional steps can be provided before, during, and after the steps shown by FIG. 4, and some of the steps described below can be replaced or eliminated, for additional embodiments of the method 400. The order of the steps may be interchangeable.

The illuminator, e.g., the illuminator 120 in FIG. 1, includes a uniformity control module (e.g., the uniformity control module 106 in FIG. 1) configured to control the intensity uniformity of an incident radiation. In an embodiment, the uniformity control module includes at least one bank of slit fingers configured to movably intersect with the incident radiation so that the intensity of the radiation at the respective slit finger can be controlled. At step 402, a radiation beam is received and directed to the illuminator. The illuminator is powered on before the radiation beam is received, and after a boot-up procedure, the illumination beam is ready for operation. In some embodiments, a patterning device, such as a photomask or reticle, is loaded into a lithography apparatus comprising the illuminator and receives the illumination beam from the illuminator. At step 404, temperatures of respective fingers in the uniformity control module is sensed. In an embodiment, a temperature measurement is taken before a shot of exposure operation is conducted. In an embodiment, another temperature measurement is taken immediately after the shot is conducted. In some embodiments, multiple temperature measurements are taken and averaged to obtain one representative temperature sensing value. The multiple temperature measurements for each of the slit finger can be taken across a short period of time, or can be taken at the same time from different portions of the slit finger, such as from a tip portion and a base portion of the slit finger, or the combinations thereof. In an embodiment, temperature measurements are retained, e.g., in a storage or memory, for deriving the shifting values of the slit fingers.

At step 406, current positions of the fingers are obtained. In an embodiment, the optimal shifting value of the slit finger is dependent upon at least one of the temperature values themselves in addition to the temperature difference between measurements. In an embodiment, the optimal shifting value of the slit finger is further dependent upon the original (current) positions of the slit finger due to varying proportional values between the shifting value and the temperature difference. In an embodiment, the current positions of the slit fingers are obtained through a sensing device, such as a range sensor or a position sensor. In an embodiment, the instant intensity profile of the light slit is measured directly. In an embodiment, a test radiation beam is emitted to determine the intensity profile of the light slit caused by the radiation source of the illuminator based on the current positions of the slit fingers. The intensity profile of the light slit may be constructed through discrete measurements in different locations of the light slit, followed by a processing operation, such as smoothing or interpolation. The data comprised of measurements of the temperature sensing may be used for determining the desired shifting value of the slit fingers by taking into account the measured intensity profile of the light slit.

At step 408, shifting values of the slit fingers are determined based on the sensed temperature values. In some embodiments, the shifting value is proportional, such as positively related, to the temperature difference, wherein the temperature difference is obtained with respect to a predetermined reference temperature. In some embodiments, the temperature difference is obtained as the difference between the two measurements before and after an exposure operation. For example, the shifting value D and the temperature difference $\Delta T$ observe the relationship of $D=k\Delta T$ where k is a predetermined shifting coefficient. The shifting coefficient k is a positive number in some embodiments, but k may be also negative in some embodiments. In some embodiments, the shifting value is positively related to the temperature values.

Figure 5:
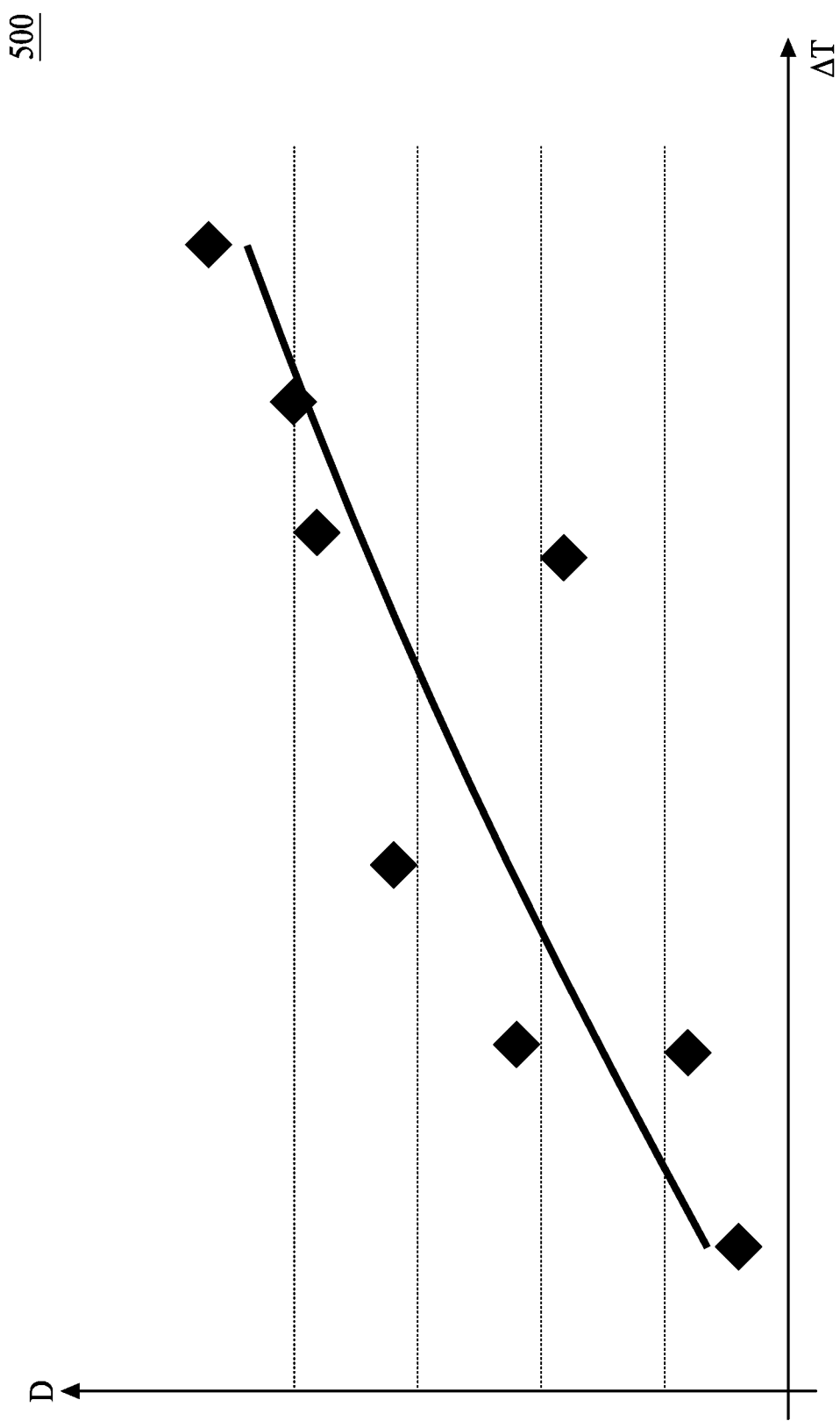
FIG. 5 is a diagram showing a sensing result for a uniformity control module, in accordance with some embodiments.

The linear relationship between the shifting value D and the temperature difference $\Delta T$ is shown for illustrative purposes in FIG. 5. Other formulas describing the relationships between the shifting value and the temperature difference with greater detail can also be utilized, such as a polynomial equation with more than one controlling coefficient, and are within the contemplated scope of the present disclosure.

At step 410, the shifting values are sent to actuating devices of respective slit fingers. The shifting values may be preprocessed, such as quantized, digitized, or encoded, or they can be averaged into a single measurement for filtering out noise. A processor and/or a controller may be introduced to perform the preprocessing and averaging. In an embodiment, the shifting value can be transmitted via wired connections or wireless channels. As a result, the shifted slit fingers contribute to the resulting updated light slit and light slit profile.

At step 412, the slit fingers are moved with the shifting values to control the slit uniformity. In some embodiments, the slit fingers are moved by actuating devices. At step 414, measurements of temperatures of the slit fingers or the measurements of the light slit profile are taken in response to the updated slit profile. Changes to light slit profiles occur in real-time and are sensitive to the shifted slit fingers.

At step 416, it is determined if the measured slit finger temperatures are balanced or the slit profile is uniform in terms of a predetermined specification. In some embodiments, it is determined if the measured slit finger temperatures are within predetermined temperature ranges. If the measured temperature values do not achieve a level of balance, or the measured light slit uniformity does not meet specification, the method 400 returns to step 406 to perform another calibration of slit fingers. In the event the current temperatures of the slit fingers are not available, the method 400 returns to step 404 as the restarting point.

If it is determined that the measured slit finger temperatures are balanced or the slit profile is uniform in terms of a predetermined specification, the exposure operation is determined to be allowed, and an exposure operation is performed upon a workpiece using the formed light slit, such as a semiconductor wafer, at step 418.

In some embodiments, one or more steps are performed subsequent to step 418 for manufacturing the semiconductor device. These steps may include, but are not limited to, developing the workpiece that was exposed in step 418, and processing of one or more layers on the workpiece, such as semiconductor layers, conductive layers and dielectric layers, using etching, deposition, ion implantation, annealing, cleaning and dicing.

FIG. 5 is a diagram 500 showing a sensing result for a uniformity control module, in accordance with some embodiments. The diagram 500 shows several experimental measurement points on a two-dimensional plot representing the relationship between the temperature measurements of the slit fingers and the shifting values of the slit fingers according to embodiments of the present disclosure. Through the experimental measurements it can be observed that a proportional relation trend, although not strictly proportional, between the temperatures and the finger shifting values. A quasi-linear line is obtained through an interpolation or approximation of the measurement points. The slope of the interpolation line can be used in determining the shifting coefficient k in step 408.

According to an embodiment, a method of operating an illuminator includes: directing a radiation beam to the illuminator comprising slit fingers; sensing a temperature value of each of the slit fingers; determining a shifting value of the respective slit finger based on the temperature value; causing the respective slit finger to move according to the shifting value to form a light slit from the radiation beam; and exposing a workpiece using the light slit.

According to an embodiment, a method of operating an illuminator includes: directing a radiation beam to the illuminator comprising slit fingers; sensing temperature values of the slit fingers; determining shifting value of the respective slit finger based on the temperature values; causing the slit fingers to move according to the shifting values to form a light slit from the radiation beam; and determining whether a profile of the light slit complies with a uniformity criterion.

According to an embodiment, an apparatus includes a light source configured to emit light and an illuminator. The illuminator includes a plurality of slit fingers configured to allow the light to pass through and form a light slit, a plurality of temperature sensors configured to sense temperature values of the slit fingers, and a plurality of actuators configured to move the corresponding slit fingers in response to a sensing result of the temperature sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating an illuminator, comprising:
   directing a radiation beam to the illuminator comprising slit fingers;
   coupling temperature sensors to the respective slit fingers, wherein each of the temperature sensors is arranged at one of a tip portion and a middle portion of the respective slit finger in an alternating manner;
   sensing a first temperature value of each of the slit fingers via the temperature sensors coupled thereto prior to a first exposure operation on a first workpiece;
   sensing a second temperature value of each of the slit fingers via the temperature sensors coupled thereto subsequent to the first exposure operation;
   determining a shifting value of the respective slit finger based on a temperature difference between the first temperature value and the second temperature value;
   causing the respective slit finger to move according to the shifting value to form a light slit from the radiation beam; and
   exposing a second workpiece using the light slit.

2. The method according to claim 1, further comprising directing the radiation beam through a reticle comprising a pattern to thereby form an exposure pattern based on the pattern.

3. The method according to claim 2, further comprising projecting the exposure pattern onto the first or second workpiece through a lens.

4. The method according to claim 1, wherein causing the respective slit finger to move by the shifting value comprises moving the respective slit finger into or out of intersection with the radiation beam.

5. The method according to claim 1, wherein determining a shifting value of the respective slit finger comprises determining the shifting value related to an average temperature value.

6. The method according to claim 5, wherein the average temperature value is obtained by averaging temperature measurements on different portions of each of the slit fingers.

7. The method according to claim 1, wherein the shifting value is proportional to the temperature difference.

8. The method according to claim 1, wherein determining a shifting value of the respective slit finger based on the temperature difference further comprises determining the shifting value based on an intensity profile of the light slit.

9. The method according to claim 1, further comprising determining whether a uniformity of the light slit complies with a criterion prior to exposing the second workpiece using the light slit.

10. The method according to claim 9, wherein determining whether a uniformity of the light slit complies with a criterion prior to exposing the second workpiece using the light slit comprises determining whether temperatures of the slit fingers are balanced.

11. The method according to claim 1, wherein sensing a first temperature value and a second temperature value of each of the slit fingers comprises sensing the first or second temperature value at the tip portions of the respective slit fingers.

12. The method according to claim 1, wherein determining a shifting value of the respective slit finger comprises determining the shifting value according to a current position of each of the slit fingers.

13. A method of operating an illuminator, comprising:
    directing a radiation beam to the illuminator comprising slit fingers;
    coupling temperature sensors to the respective slit fingers, wherein each of the temperature sensors is arranged at one of a tip portion and a middle portion of the respective slit finger in an alternating manner;
    sensing a temperature difference of each of the slit fingers via the respective temperature sensors;
    determining an intersection amount, of each of the slit fingers, with the radiation beam according to a linear relationship with the temperature difference;
    determining a shifting value of the respective slit finger based on the intersection amount of the respective slit finger;
    causing the slit fingers to move according to the shifting value of each of the slit fingers to form a light slit from the radiation beam; and
    determining whether a profile of the light slit complies with a uniformity criterion.

14. The method according to claim 13, further comprising directing the light slit through a reticle comprising a circuit pattern to form an exposure pattern based on the circuit pattern in response to determining that the profile of the light slit complies with the uniformity criterion.

15. The method according to claim 13, wherein the shifting value of the respective slit finger is determined further based on a shifting coefficient.

16. The method according to claim 13, further comprising obtaining positions of the slit fingers.

17. An apparatus, comprising:
    a light source configured to emit light; and
    an illuminator, comprising:
      a plurality of slit fingers configured to allow the light to pass through and form a light slit;
      a plurality of temperature sensors coupled to the respective slit fingers and configured to sense temperature difference values of the respective slit fingers, wherein each of the temperature sensors is arranged at one of a tip portion and a middle portion of the respective slit finger in an alternating manner; and
      a plurality of actuating devices configured to move the slit fingers with moving amounts proportional to the temperature difference values of the temperature sensors.

18. The apparatus according to claim 17, further comprising a reticle stage configured to hold a reticle comprising a pattern thereon and allow the light slit received from the illuminator to pass through to thereby form an exposure pattern.

19. The apparatus according to claim 18, further comprising a lens configured to project the exposure pattern onto a workpiece.

20. The apparatus according to claim 17, wherein each of the slit fingers is configured to move in a direction to control an amount of the light passing through a space defined by the slit fingers.

* * * * *